United States Patent
Rosetti et al.

(10) Patent No.: US 8,064,843 B2
(45) Date of Patent: Nov. 22, 2011

(54) ELECTRICAL COMPONENT FOR THE FRONT END CIRCUIT OF A TRANSCEIVER

(75) Inventors: Luigi Rosetti, Munich (DE); Juergen Kiwitt, Munich (DE); Maximilian Pitschi, Rottach-Egern (DE); Andreas Fleckenstein, Ulm (DE); Andreas Przadka, Munich (DE)

(73) Assignee: EPCOS AG, Munich (DE)

( * ) Notice: Subject to any disclaimer, the term of this patent is extended or adjusted under 35 U.S.C. 154(b) by 888 days.

(21) Appl. No.: 12/064,973

(22) PCT Filed: Sep. 1, 2006

(86) PCT No.: PCT/DE2006/001539
§ 371 (c)(1),
(2), (4) Date: Apr. 17, 2008

(87) PCT Pub. No.: WO2007/031051
PCT Pub. Date: Mar. 22, 2007

(65) Prior Publication Data
US 2008/0238567 A1  Oct. 2, 2008

(30) Foreign Application Priority Data

Sep. 12, 2005  (DE) .................. 10 2005 043 373
Sep. 12, 2005  (DE) .................. 10 2005 043 375

(51) Int. Cl.
*H04B 1/44* (2006.01)

(52) U.S. Cl. ......... 455/78; 455/83; 455/255; 455/191.3; 333/103; 333/132; 333/134; 333/175

(58) Field of Classification Search .................... 455/78, 455/83, 225, 191.3; 333/103–104, 132–133, 333/134, 175, 17.3
See application file for complete search history.

(56) References Cited

U.S. PATENT DOCUMENTS

| 5,634,200 | A |   | 5/1997  | Kitakubo et al. |
|-----------|---|---|---------|-----------------|
| 5,798,730 | A | * | 8/1998  | Sanchez .................. 342/195 |
| 5,818,656 | A | * | 10/1998 | Klaassen et al. ............ 360/67 |
| 5,864,265 | A |   | 1/1999  | Balance et al. |
| 5,914,544 | A | * | 6/1999  | Tanaka et al. .............. 307/130 |
| 5,926,075 | A | * | 7/1999  | Hayashi .................... 333/101 |
| 5,969,582 | A | * | 10/1999 | Boesch et al. ............. 333/129 |
| 6,332,071 | B1 | * | 12/2001 | Brandt ....................... 455/82 |

(Continued)

FOREIGN PATENT DOCUMENTS

EP  0 788 182  8/1997

(Continued)

OTHER PUBLICATIONS

Ikata et al., "A Designed of Antenna Duplexer using Ladder Type Saw Filters", IEEE Ultrasonics Symposium, 1998, pp. 1-4.
Larson et al., "A BAW Antenna Duplexer for the 1900 MHz PCS Band", IEEE Ultrasonics Symposium, 1999, pp. 887-890.

(Continued)

*Primary Examiner* — Marceau Milord
(74) *Attorney, Agent, or Firm* — Fish & Richardson P.C.

(57) ABSTRACT

An electrical component includes a first signal path and a second signal path electrically connected to a common signal path. The electrical component also includes a first filter in the first signal path and a second filter in the second signal path. The electrical component also includes a first matching circuit comprising a shunt arm to ground. The first matching circuit is electrically connected to the first signal path, the second signal path, and the common signal path.

22 Claims, 2 Drawing Sheets

U.S. PATENT DOCUMENTS

| | | | |
|---|---|---|---|
| 6,731,184 | B1 | 5/2004 | Muto et al. |
| 6,870,442 | B1 * | 3/2005 | Suzuki et al. .................. 333/133 |
| 6,983,129 | B2 * | 1/2006 | Satoh et al. ...................... 455/82 |
| 7,032,297 | B2 | 4/2006 | Cahill et al. |
| 7,057,472 | B2 * | 6/2006 | Fukamachi et al. ........... 333/101 |
| 7,242,268 | B2 * | 7/2007 | Hagiwara et al. .............. 333/133 |
| 7,650,163 | B2 * | 1/2010 | Aggarwal et al. .......... 455/553.1 |
| 7,660,562 | B2 * | 2/2010 | Onno et al. ................. 455/114.1 |
| 2003/0020562 | A1 | 1/2003 | Ikada et al. |
| 2004/0087286 | A1 | 5/2004 | Inoue et al. |
| 2004/0227585 | A1 | 11/2004 | Taniguchi et al. |
| 2005/0281210 | A1 | 12/2005 | Makino |

FOREIGN PATENT DOCUMENTS

| | | |
|---|---|---|
| EP | 1 037 308 | 9/2000 |
| EP | 1 557 944 | 7/2005 |
| JP | 2003-115748 | 4/2003 |
| JP | 2005-184773 | 7/2005 |
| WO | WO 99/01931 | 1/1999 |
| WO | 2004-102798 | 11/2004 |

OTHER PUBLICATIONS

Marksteiner et al., "A Miniature BAW Duplexer using Flip-Chip on LTCC", IEEE Ultrasonics Symposium, 2003, pp. 1794-1797.

Onzuka et al., "SAW Duplexers without λ/4 Phase Shifter for PDC Cellular Phone Systems", IEEE Ultrasonics Symposium, 2003, pp. 2101-2104.

Shibagaki et al., "Precise Designed Technique for a SAW-Resonator-Couple Filter on 36° YX-LiTaO$_3$ for use in a GSM SAW Duplexer Module for Satisfying all GSM System Specifications", IEEE Ultrasonics Symposium, 1996, pp. 19-24.

Shibagaki et al., "Miniature SAW Antenna Duplexer Module for 1.9 GHz PCN Systems using SAW-Resonator-Coupled Filters", IEEE MTT-S International, vol. 2, Jun. 7-12, 1998, pp. 499-502.

International Search Report for corresponding PCT Application No. PCT/DE2006/001539, mailed Dec. 13, 2006, in English and German language, 3 pages each.

English translation of Written Opinion for PCT/DE2006/001539.

Notification of Reasons for Refusal (type I office action), in JP Pat. Appl. No. 2008-530316, mailed Apr. 21, 2011, 2 pages.

* cited by examiner

ELECTRICAL COMPONENT FOR THE FRONT END CIRCUIT OF A TRANSCEIVER

CROSS REFERENCE TO RELATED APPLICATIONS

Pursuant to 35 USC §120, this application claims the benefit of PCT/DE2006/001539 filed Sep. 1, 2006 which claims the benefit of German Patent Application No. 102005043375.8 filed Sep. 12, 2005 and German Patent Application No. 102005043373.1 filed Sep. 12, 2005. Each of these applications is incorporated by reference in its entirety.

1. Field of the Invention

An electrical component that can be used in the front end circuit of a transmitting-receiving device is described.

2. Background

A component with a front end circuit is known, for example, from document EP 0788182 A2 or U.S. Pat. No. 6,731,184. Another front end circuit is described in the document Shibagaki, Sakiyama, Hikita "Miniature SAW Duplexer Module for 1.9 GHz PCN Systems Using SAW-Resonator-Coupled Filters," IEEE MTT S International Microwave Symposium Digest, 1998, Vol. 2, p. 499.

SUMMARY

A problem to be solved consists in providing an electrical component that presents low losses.

According to a first preferred embodiment, an electrical component is described with a first signal path and a second signal path, which are connected to a common signal path. A first filter is arranged in the first signal path, and a second filter is arranged in the second signal path. The component comprises a first matching circuit that comprises a shunt arm connected to ground. In the shunt arm, an inductor is arranged, which is connected to the first signal path, to the second signal path, and to the common signal path. The component comprises a carrier substrate on which the filters, which are preferably constructed as chips, are mounted. The inductor is integrated in the carrier substrate.

The first matching circuit and optionally a second matching circuit, which is explained below, match the input impedances of the first filter and of the second filter in such a way that the signal path presents a high input impedance in the adjacent channel in each case. The first matching circuit and the second matching circuit preferably form an antenna-side matching network.

The common signal path is preferably provided as an antenna path. In an advantageous variant, the first signal path is provided as a transmitting path and the second signal path as a receiving path. The first filter is then provided as a transmitting filter and the second filter is provided as a receiving filter. The antenna path branches into the transmission path and the receiving path. In this case, the filters, together with the first matching circuit, form a duplexer.

In an additional advantageous variant, the first signal path and the second signal path are each provided as a receiving path. The first signal path can be assigned, for example, to the receiving band of the radio system GSM800 and the second signal path to the receiving band of the radio system GSM900.

In the shunt arm, a first capacitor can be arranged, which is series connected to the inductor. The arrangement of the first capacitor in the shunt arm toward ground has the advantage that the direct-current path toward ground is thus interrupted.

In a variant, a second matching circuit is provided, which is arranged in the second signal path. The second matching circuit is arranged between the first matching circuit and the second filter. The second matching circuit presents a second capacitor, which is arranged in a series arm of the second signal path. In the series arm of the first signal path, a third matching circuit can be arranged in principle, which is arranged preferably between the first matching circuit and the first filter.

The second capacitor, which is arranged in the series arm, is also referred to below as a series capacitor, and the inductor arranged in the shunt arm is referred to as a parallel inductor. A matching network, comprising a parallel inductor and a series capacitor, is particularly space saving in view of the integration in a carrier substrate, compared to a matching network with a transmission line (for example, $\lambda/4$ line).

The series capacitor is implemented in a variant in the carrier substrate, and it comprises, for example, at least two superposed conducting surfaces. The series capacitor may also be designed as multilayered capacitor with electrode surfaces that mesh and present a comb-like cross section, or as a planar interdigital structure.

The first matching circuit and the second matching circuit are capacitatively coupled to each other with formation of a coupling capacitor, in an advantageous variant.

The pass band of the transmitting filter and receiving filter is preferably in a frequency range in which the Q factor of an effective impedance element formed by the inductor and the coupling capacitor is at least half its maximum value.

The effective impedance element, which comprises the inductor, is arranged in the equivalent circuit diagram in the shunt arm, and it is also referred to as the effective inductance. As a result of the coupling capacitor it is possible, for example, to successively increase the effective inductance value of the effective impedance element in a predetermined frequency range. The predetermined frequency range can, for example, overlap at least partially with the pass bands of the duplexer, or be in the pass bands of the duplexer. The predetermined frequency range can also be outside (above or below) these pass bands.

Because the effective inductance value can be increased by the capacitive coupling of the inductor with conducting elements-explained in greater detail below—at the desired frequency, the frequency-independent inductance value itself of the inductor can be chosen to be relatively small. This is advantageous for a space saving design of the inductor.

A coupling capacitor is formed particularly between the mutually opposite conducting elements, i.e., conductors and/or conducting surfaces. The elements to be coupled capacitatively to each other can be arranged one above the other or next to each other depending on the design.

To form a coupling capacitor, in a variant, a conductor associated with the inductor and one of the conducting surfaces associated with the first capacitor are arranged one above the other or next to each other. To form an (additional) coupling capacitor, the conductor associated with the inductor and one of the conducting surfaces associated with the first capacitor can be arranged on top of each other or next to each other. A coupling capacitor can also be formed by arranging the conductor associated with the inductor and a ground surface one above the other or next to each other.

The coupling capacitor and the inductor, in a variant, form a parallel oscillation circuit, whose resonance frequency is above the pass bands of the first filter and of the second filter. The resonance frequency of the parallel oscillation circuit can, for example, be greater by a factor of 1.5 than the middle frequency of the duplexer that comprises the first filter and the second filter.

The series circuit of the inductor and of the first capacitor, in a variant, presents a series resonance at a frequency that is below the pass bands of the first filter and of the second filter. The series resonance frequency can be, for example, at most, half the middle frequency of the duplexer and, in a preferred variant, at most, 1/3 of the middle frequency of the duplexer.

The carrier substrate comprises several metallization planes and, arranged between them, dielectric layers based on an LTCC ceramic. LTCC stands for low temperature cofired ceramics. However, it is also possible to consider using, as material for the dielectric layers, any electrically insulating materials that ensure a relatively high Q factor of the inductor.

The first matching circuit and the second matching circuit are integrated in an advantageous variant at least partially in the carrier substrate, where the inductors and capacitors contained in the matching circuits are implemented preferably by means of conductors and conducting surfaces in the metallization planes of the carrier substrate. This applies particularly to the inductor arranged in the shunt arm, the first capacitor and the second capacitor.

The capacitors can comprise conducting surfaces arranged in different metallization planes lying one above the other. At least one of the capacitors, however, can also be produced entirely or partially in a chip that is mounted on the carrier substrate. The capacitors can also be produced in each case by static capacitance of an interdigital transducer.

The inductor can, for example, be designed as a conductor whose width is substantially smaller than its length. The inductor can, for example, be produced by a spiral-shaped or meander-shaped, folded conductor. The inductor can present superposed parts that are conductively connected by continuous contacting, and that are arranged in different metallization planes of the carrier substrate. The conductor that produces the inductor can be used for the formation of at least a part of the first or second capacitor.

For the formation of the coupling capacitor, it is possible to arrange a conducting surface assigned to the first capacitor and a conducting surface assigned to the second capacitor in different metallization planes of the substrate, one above the other, or in the same plane of the substrate, next to each other.

In a variant, the conducting surface associated with the first capacitor is connected to ground. In an additional variant, this surface is isolated from ground.

For the formation of the coupling capacitor, it is also possible to arrange a conductor associated with the inductor and a surface associated with the second capacitor one above the other or next to each other.

The filters are preferably band-pass filters. The filters can comprise particular component structures that work with acoustic waves, such as, for example, resonators, converters, acoustic reflectors. The electrically interconnected resonators that work with acoustic surface waves and/or bulk waves can, for example, form a ladder type arrangement (ladder circuit).

The first filter can be implemented in a first chip and the second filter in a second chip that are both mounted on the carrier substrate. However, the filters can also be implemented in a common chip that is mounted on the carrier substrate. The chips can be electrically connected to the carrier substrate, for example, by bumps or bond wires.

The carrier substrate and the filters form a component unit with preferably surface-mountable external connections that are arranged on the bottom side of the carrier substrate.

According to a second preferred embodiment, an electrical component is provided that provides a signal path, for example, in the form of a receiving path, to which a pass band (for example, a receiving band) is assigned. The component comprises a first matching circuit that comprises a shunt arm toward ground that is connected to the signal path. In addition, a second matching circuit is provided that is arranged in the signal path and coupled capacitatively, with the formation of a coupling capacitor, to the first matching circuit.

In a preferred variant, an inductor is arranged in the shunt arm that is arranged in the first matching circuit. In the shunt arm, a series connection can be provided between the inductor and a first capacitor. The resonance frequency of this series connection is preferably below the band pass of the signal path.

The second matching circuit, in a variant, presents a second capacitor arranged in the signal path, where, between the series connection and the second capacitor, a coupling capacitor is formed, and where the inductor and the coupling capacitor form an effective impedance element.

The coupling capacitor can form a parallel oscillation circuit with the inductor. Here the dimensions of the inductor and of the coupling capacitor are chosen so that the resonance frequency of the parallel oscillation circuit is above the pass band.

The first matching circuit and the coupling capacitor form an effective impedance element that is connected to ground, whose Q factor Q depends on the frequency f. The pass band is in a frequency range in which the Q factor of the effective impedance element is at least half its maximum value $Q_{max}$, i.e., $Q \geq Q_{max}/2$. The operating point (operating frequency) is preferably in a frequency range between the maximum $Q_{max}$ of the Q factor Q(f) and its half-value point $Q_{max}/2$ above the Q factor maximum, because in this case the effective inductance is greater than in the frequency area below the maximum.

Here elements of the first matching circuit and of the second matching circuit are given dimensions, and arranged relative to each other, to form the desired coupling capacitor in such a way that the range of a relatively high Q factor of the effective impedance element $Q \geq Q_{max}/2$ corresponds to the frequency range that comprises the pass band.

The first signal path and the second signal path, in a variant, are asymmetric to ground (single-ended). At least one of these paths, which is designed, for example, as a receiving path, can also be symmetric (balanced) to ground.

Below, the component is explained in accordance with the first and the second preferred embodiments in reference to diagrammatic figures that are not true to scale. In the drawing:

DESCRIPTION OF THE DRAWINGS

FIGS. 2, 2A respectively show sections of the matching circuit shown in FIG. 1B with coupling capacitors;

DETAIL DESCRIPTION

Figure 1A:
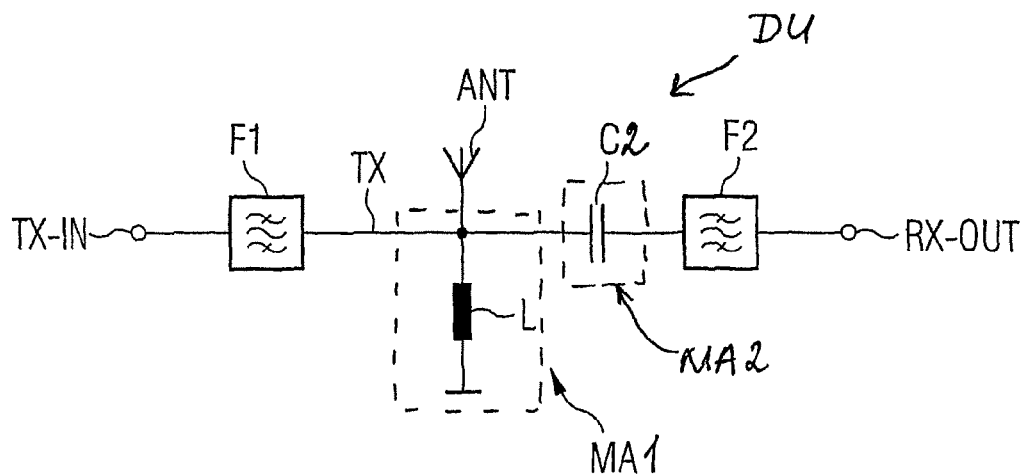
FIG. 1A shows a duplexer with a parallel inductor between antenna and ground, and a series capacitor in the receiving path.

FIG. 1A shows a circuit with a first signal path designed as a transmitting path TX and a second signal path designed as a receiving path RX. The paths RX, TX are combined into a common antenna path ANT.

In the transmitting path TX, a first filter F1 designed as a transmitting filter, and, in the receiving path RX, a second filter F2 designed as a receiving filter, are arranged. Between the filters F1, F2, a matching network is arranged which, in the variant shown in FIG. 1A, comprises a first matching circuit MA1 and a second matching circuit MA2.

The first matching circuit MA1 presents a shunt arm to ground, which connects the common nodes of the paths TX, RX and ANT to ground. In the shunt arm, a parallel inductor L is arranged. A second matching circuit MA2, which is arranged in the second signal path between the second filter F2 and the common node of the paths TX, RX and ANT, comprises a series capacitor C2 arranged in the series arm. In principle, a series capacitor can also be arranged in the first signal path TX.

In the variant shown in FIG. 1A, the inductor L is connected directly to the antenna-side gate of the first filter F1. In principle, it is possible to omit the series capacitor C2 depending on the impedance of the filters F1, F2. The inductor L is then connected directly to the antenna-side gate of the filters F1, F2.

The filters F1, F2 and the matching circuits MA1, MA2 together form a duplexer DU. The duplexer presents an antenna input ANT, a transmission input TX-IN and a reception output RX-OUT. The transmitting path TX is arranged between the antenna input ANT and the transmission input TX-IN. The receiving path RX is arranged between the antenna input ANT and the receiving output RX-OUT.

Figure 1B:
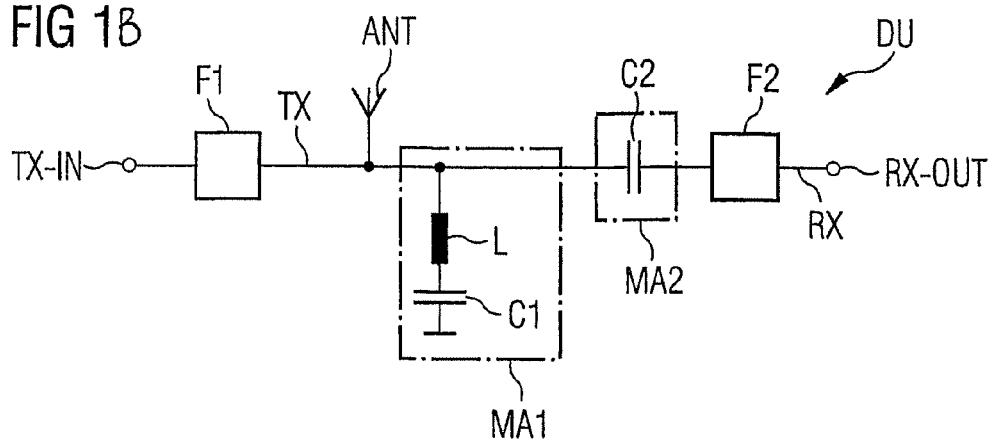
FIG. 1B shows a duplexer with a matching circuit, which comprises a series circuit connected to ground of an inductor and of a capacitor.

In FIG. 1B, an additional embodiment is presented. In the shunt arm of the first matching circuit MA1, a series circuit of the inductor L and of a first capacitor C1 is arranged. This series circuit is connected to the antenna path. For the rest the description of FIG. 1A applies.

The filters, in a preferred variant, comprise electro-acoustic resonators, for example, SAW resonators and/or BAW resonators. These filters are respectively implemented in the variant shown in FIG. 3 in a filter chip CH1, CH2. The transmitting filter F1 is implemented in the filter chip CH1, and the receiving filter F2 in the filter chip CH2. The filter chips CH1, CH2 are here affixed in a flip-chip structure to the carrier substrate SU.

In a variant it is possible for the transmitting filter and also the receiving filter to be implemented jointly in a chip. In another variant, the components of the transmitting filter and of the receiving filter, particularly the BAW resonators, can be arranged on the carrier substrate SU, instead of in a filter chip.

The first and/or second capacitor C1, C2 can comprise conducting surfaces arranged in different metallization planes of the carrier substrate SU, preferably in a position where they are mutually horizontally or vertically opposite. The first and/or second capacitor C1, C2, in a variant, can be implemented by the effective capacitance of an electro-acoustic resonator, which can be arranged in the filter chip or on the carrier substrate SU.

Figure 2:
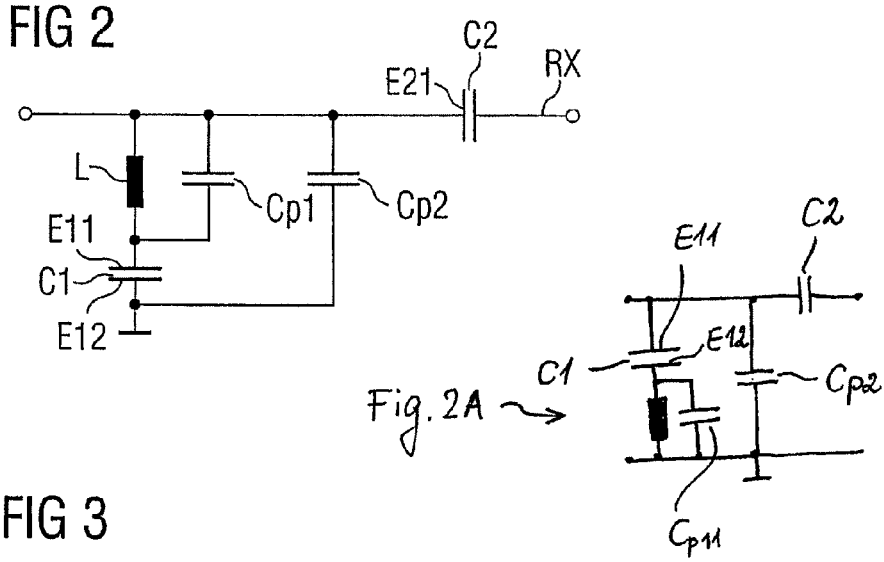

In FIG. 2, an explanation is provided of how the coupling capacitors Cp1, Cp2 form between the first and the second matching circuit MA1, MA2.

It is preferred for the electrode E21 of the second capacitor C2, which is facing away from the receiving filter F2, to be coupled capacitatively to a conducting element of the first matching circuit MA1. This conducting element can be, for example, a conductor that implements the inductor L1 and which, in a variant, faces the electrode E21. A part of the coupling capacitor Cp1 is formed here. The electrode E21 and the inductor L1 can be arranged next to each other in a metallization plane of the carrier substrate SU, or on top of each other in different metallization planes of this substrate.

The mentioned conducting element can also be the electrode E12—connected to ground-of the first capacitor C1 and/or its electrode E11 isolated from ground. Here, the coupling capacitor Cp2 is formed between the electrodes E12 and E21, or an additional part of the coupling capacitor Cp1 is formed between the electrodes E11 and E21.

The coupling capacitors Cp1, Cp2 can also be formed between the connection lines that are connected to the electrode E21 of the second capacitor C2, and to the electrodes E11 and E12 of the first capacitor C1, respectively.

An additional coupling capacitor can also be formed, such as, for example, the capacitor Cp11 in the variant represented in FIG. 2A, between the conductor that implements the inductor L and a ground surface or conductor surface (electrode E11 or El 2) facing the conductor of the capacitor C1. It is possible to form a coupling capacitor between different coils-arranged next to each other—of the inductor.

The first capacitor C1 is preferably considerably greater (for example, by at least a factor of five) than the coupling capacitors Cp1, Cp2.

Figure 3:
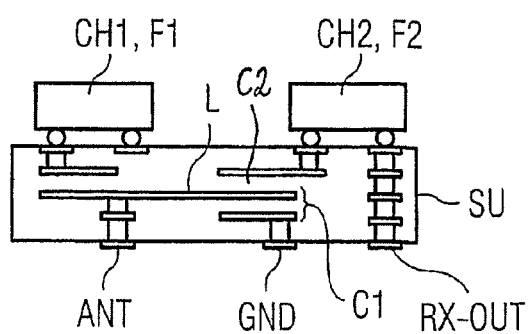
FIG. 3 shows an electrical component with a multi-layered substrate, in which the duplexer according to FIG. 1A or 1B is implemented.

The capacitors to be coupled to each other, for example, C1 and C2 in FIGS. 1A, 1B and 2, can both be formed in a chip-in FIG. 3 the chip CH1 or CH2—that is mounted on the carrier substrate SU. It is possible to implement these capacitors and the filters F1, F2 in a chip that works with acoustic waves, where the capacitors are implemented by the static capacitance of an electro-acoustic converter or resonator.

In all the variants, the second matching circuit MA2 can present, besides the series capacitor C2, additional LC elements that can be arranged in the series arm, or at least one additional shunt arm that is connected to the second signal path. However, it has already been observed that the matching of the two signal paths, in which the filters F1, F2 are arranged, can be achieved also with a few, for example, only two or three, matching elements L, C1 and/or C2. This applies particularly to the matching of signal paths that are connected to each other and designed for transmission systems whose frequency bands are not far apart from each other. The ratio of the middle frequencies of the frequency bands can be, for example, in the range 0.7 . . . 1.4.

The use of only a few matching elements in the antenna-side matching network has the advantage that it allows a reduction in signal losses.

Figure 4:
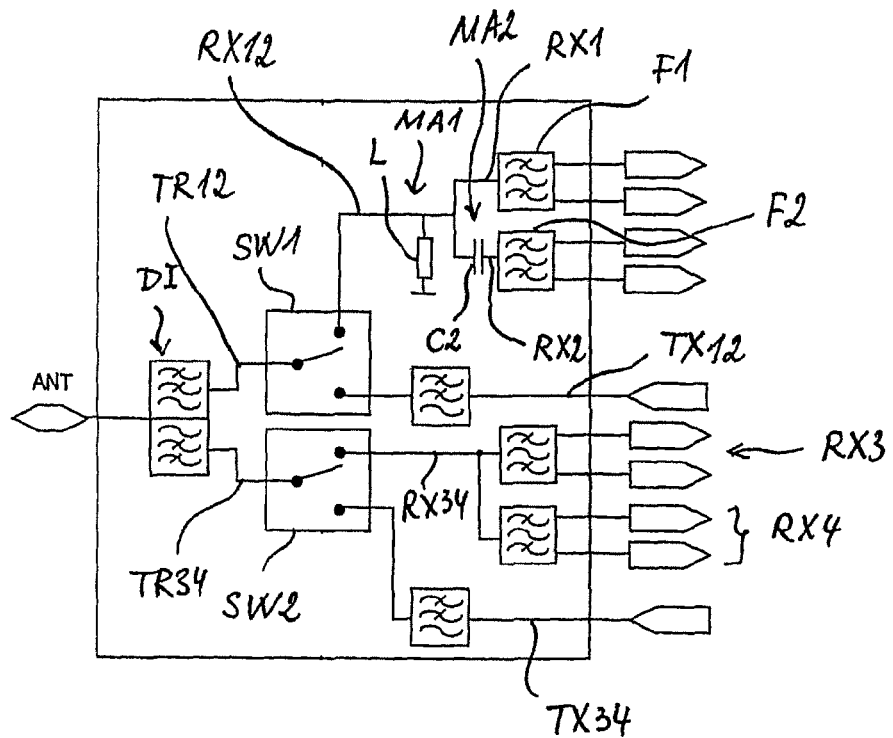
FIG. 4 shows the equivalent diagram of a component, in which a front end circuit with a parallel inductor in the antenna-side matching network is implemented.

In the variant presented in FIG. 4, the first receiving path RX1 is designed as a first signal path, and the second signal path is designed as a second receiving path RX2. The antenna-side matching network, which comprises the matching circuits MA1 and MA2, is designed as in FIG. 1A, but it can also be designed as in FIG. 1B, and/or without the second matching circuit MA2.

The first receiving path RX1 is designed for receiving the data of a first transmission system, for example, GSM800, and the second receiving path RX2 is designed for receiving the data of a second transmission system, for example, GSM900. The transmitted data of the two transmission systems are transmitted in a common transmitting path TX12. The receiving paths RX1, RX2 are combined on the antenna-side to a common receiving path RX12. The paths TX12 and RX12 are alternately connected conductively by means of a first switch SW1 to a first transmission-receiving path TR12.

The component whose block diagram is shown in FIG. 4 is also suited for the data transmission of additional transmission systems.

The third receiving path RX3 is designed here for receiving the data of a third transmission system, for example, DCS, and the fourth receiving path RX4 is designed for receiving the data of a fourth transmission system, for example, PCS. The sent data of the third and of the fourth transmission system are transmitted in a common transmitting path TX34. The receiving paths RX3, RX4 are combined on the antenna side to a common receiving path RX34. The paths TX34 and RX34 are alternately connected conductively by means of a second switch SW2 to a second transmitting-receiving path TR34.

The transmission-receiving paths TR12 and TR34 are connected electrically to the antenna path ANT on the antenna side by means of a duplexer DI.

In principle, it is also possible to adapt the receiving paths RX3 and RX4 to each other on the antenna side by means of an above-explained matching network in such a way that each signal path presents a high input impedance in the counter band.

The signal paths TX, RX in FIGS. 1A, 1B, 2 can be replaced as in FIG. 4 with two receiving paths RX1, RX2, or vice versa. The characteristics that are described in connection with one of the embodiments shown in the figures are directly applicable to other variants.

The invention claimed is:

1. An electrical component, comprising:
a first signal path and a second signal path electrically connected to the common signal path,
a first filter in the first signal path, the first filter being mounted on a carrier substrate,
a second filter in the second signal path, the second filter being mounted on the carrier substrate,
a first matching circuit comprising a shunt arm to ground that includes an inductor in the carrier substrate, the first matching circuit being electrically connected to the first signal path, the second signal path, and the common signal path.

2. The component of claim 1, wherein:
the common signal path comprises an antenna path;
the first signal path comprises a transmitting path; and
the second signal path comprises a receiving path.

3. The component of claim 1, wherein
the common signal path comprises an antenna path;
the first signal path comprises a receiving path; and
the second signal comprises a receiving path.

4. The component of claim 1, wherein the shunt arm further comprises a first capacitor connected in series with the inductor.

5. The component of claim 4, wherein the first capacitor and the inductor provide a series resonance at a frequency below pass bands of the first filter and the second filter.

6. The component of claim 1, further comprising a second matching circuit between the common signal path and the second filter, the second matching circuit comprising a second capacitor in series with the second signal path.

7. The component of claim 6, wherein at least one of the first capacitor and the second capacitor is in the carrier substrate.

8. The component of claim 6, wherein at least one of the first capacitor and the second capacitor is in a chip mounted on the carrier substrate and electrically connected to the carrier substrate.

9. The component of claim 6, wherein the second matching circuit is at least partially in the carrier substrate.

10. The component of claim 6, wherein the the first matching circuit is capacitatively coupled to the second matching circuit by a coupling capcaitor, the coupling capacitor and the inductor forming a parallel oscillating circuit, having a resonance frequency above pass bands of the first filter and of the second filter.

11. The component of claim 10, wherein the coupling capacitor comprises a first conducting surface associated with the first capacitor and a second conducting surface associated with the second capacitor, the first conducting surface being on top of, below, or next to the second conducting surface.

12. The component of claim 11, wherein the first conducting surface is connected to ground.

13. The component of claim 11, wherein the first conducting surface is isolated from ground.

14. The component of claim 10, wherein the coupling capacitor comprises a conductor associated with the inductor and a conducting surface associated with the second capacitor on top of, below, or next to the conductor associated with the inductor.

15. The component of claim 6, wherein the second capacitor comprises an electro-acoustic resonator.

16. The component of claim 15, wherein the resonance frequency of the electro-acoustic resonator is above band passes of the first filter and the second filter.

17. The component of claim 1, wherein the filters are configured to work with acoustic waves.

18. The component of claim 1, further comprising an additional coupling capacitor comprising a conductor associated with the inductor and a conducting surface associated with the first capacitor on top of, below, or next to the conductor associated with the inductor.

19. The component of claim 18, wherein the additional coupling capacitor and the inductor are configured to form a parallel oscillating circuit having a resonance frequency above pass bands of the first filter and the second filter.

20. The component of claim 1, further comprising an additional coupling capacitor comprising a conductor associated with the inductor and a ground surface on top of, below, or next to the conductor associated with the inductor.

21. The component of claim 1, wherein the second matching circuit further comprises an additional inductor and an additional capacitor forming an LC circuit, the LC circuit connected in series with the second signal path.

22. The component of claim 1, wherein the second matching circuit further comprises an additional shunt arm connected to the second signal path.

* * * * *

UNITED STATES PATENT AND TRADEMARK OFFICE
CERTIFICATE OF CORRECTION

| | |
|---|---|
| PATENT NO. | : 8,064,843 B2 |
| APPLICATION NO. | : 12/064973 |
| DATED | : November 22, 2011 |
| INVENTOR(S) | : Luigi Rosetti et al. |

It is certified that error appears in the above-identified patent and that said Letters Patent is hereby corrected as shown below:

Claim 1, Column 7, Line 31 - delete "to the" and insert -- to a --, therefor.

Claim 10, Column 8, Line 10 - delete "the" after "the".

Claim 10, Column 8, Line 12 - delete "capcaitor," and insert -- capacitor, --, therefor.

Claim 10, Column 8, Line 13 - delete "circuit." and insert -- circuit --, therefor.

Signed and Sealed this
Fourteenth Day of February, 2012

David J. Kappos
*Director of the United States Patent and Trademark Office*